US012802729B2

(12) United States Patent
Woo

(10) Patent No.: US 12,802,729 B2
(45) Date of Patent: Nov. 17, 2026

(54) SEMICONDUCTOR DEVICE

(71) Applicant: SK hynix Inc., Icheon-si (KR)

(72) Inventor: Take Kyun Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 196 days.

(21) Appl. No.: 18/937,948

(22) Filed: Nov. 5, 2024

(65) Prior Publication Data

US 2025/0061931 A1 Feb. 20, 2025

Related U.S. Application Data

(63) Continuation of application No. 18/064,757, filed on Dec. 12, 2022, now Pat. No. 12,165,741.

(30) Foreign Application Priority Data

Jul. 27, 2022 (KR) ........................ 10-2022-0093197

(51) Int. Cl.
*G11C 8/08* (2006.01)
*G11C 5/02* (2006.01)
(Continued)

(52) U.S. Cl.
CPC ................ *G11C 8/08* (2013.01); *G11C 5/025* (2013.01); *G11C 5/063* (2013.01); *G11C 11/1655* (2013.01); *G11C 11/1657* (2013.01); *G11C 11/2255* (2013.01); *G11C 11/2257* (2013.01); *G11C 11/4085* (2013.01);
(Continued)

(58) Field of Classification Search
CPC ....... G11C 8/08; G11C 5/063; G11C 11/4085; G11C 11/4097; G11C 11/1655; G11C 11/1657; G11C 11/2257; G11C 2213/71; G11C 13/0026; G11C 5/025; G11C 11/2255; G11C 13/0028; G11C 13/0007; H10B 99/22; H10B 43/27; H10B 43/40; H10B 63/10; H10B 63/84; H10B 63/30; H10D 84/80; H10N 70/826
See application file for complete search history.

(56) References Cited

U.S. PATENT DOCUMENTS

| | | | | |
|---|---|---|---|---|
| 11,063,062 | B2 | 7/2021 | Iijima et al. | |
| 2020/0144242 | A1 * | 5/2020 | Park | H10B 41/27 |
| 2022/0076759 | A1 * | 3/2022 | Park | G06F 13/1668 |

FOREIGN PATENT DOCUMENTS

| | | | |
|---|---|---|---|
| KR | 10-2020-0119474 | A | 10/2020 |
| KR | 10-2022-0092539 | A | 7/2022 |

* cited by examiner

*Primary Examiner* — Alexander Sofocleous
*Assistant Examiner* — Joseph Fidelis Stormes

(57) ABSTRACT

A semiconductor device may include: a first substrate structure including: a first substrate; a first word line, a first bit line, a second bit line, a second word line, a third word line, a third bit line, a fourth bit line, and a fourth word line that are sequentially arranged over the first substrate in a vertical direction; and first, second, third, and fourth memory cells, the first memory cell being disposed between the first word line and the first bit line, the second memory cell being disposed between the second word line and the second bit line, the third memory cell being disposed between the third word line and the third bit line, and the fourth memory cell being disposed between the fourth word line and the fourth bit line; and a second substrate structure disposed over the first substrate structure and including a second substrate.

16 Claims, 11 Drawing Sheets

(51) Int. Cl.

| | |
|---|---|
| ***G11C 5/06*** | (2006.01) |
| ***G11C 11/16*** | (2006.01) |
| ***G11C 11/22*** | (2006.01) |
| ***G11C 11/408*** | (2006.01) |
| ***G11C 11/4097*** | (2006.01) |
| ***G11C 13/00*** | (2006.01) |
| ***H10B 43/27*** | (2023.01) |
| ***H10B 43/40*** | (2023.01) |
| ***H10B 63/00*** | (2023.01) |
| ***H10B 63/10*** | (2023.01) |
| ***H10B 99/00*** | (2023.01) |
| ***H10D 84/80*** | (2025.01) |
| ***H10N 70/00*** | (2023.01) |

(52) U.S. Cl.
CPC ...... *G11C 11/4097* (2013.01); *G11C 13/0007* (2013.01); *G11C 13/0026* (2013.01); *G11C 13/0028* (2013.01); *H10B 43/27* (2023.02); *H10B 43/40* (2023.02); *H10B 63/10* (2023.02); *H10B 63/30* (2023.02); *H10B 63/84* (2023.02); *H10B 99/22* (2023.02); *H10D 84/80* (2025.01); *H10N 70/826* (2023.02); *G11C 2213/71* (2013.01)

SEMICONDUCTOR DEVICE

CROSS-REFERENCE TO RELATED APPLICATION

This application is a continuation of U.S. patent application Ser. No. 18/064,757, filed on Dec. 12, 2022, which claims priority under 35 U.S.C. § 119 to Korean Patent Application No. 10-2022-0093197 filed on Jul. 27, 2022, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include storage devices which can store data using a characteristic of switching between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

In an embodiment, a semiconductor device may include: a first substrate structure including: a first substrate; a first word line, a first bit line, a second bit line, a second word line, a third word line, a third bit line, a fourth bit line, and a fourth word line that are sequentially arranged over the first substrate in a vertical direction; and first, second, third, and fourth memory cells, the first memory cell being disposed between the first word line and the first bit line, the second memory cell being disposed between the second word line and the second bit line, the third memory cell being disposed between the third word line and the third bit line, and the fourth memory cell being disposed between the fourth word line and the fourth bit line; and a second substrate structure disposed over the first substrate structure and including a second substrate, wherein the first and second word lines, and the first and second bit lines are connected to a first driving circuit included in the first substrate, and wherein the third and fourth word lines, and the third and fourth bit lines are connected to a second driving circuit included in the second substrate.

In an embodiment, a method for fabricating a semiconductor device includes: forming a first substrate structure; forming a second substrate structure including a second substrate; disposing the second substrate structure over the first substrate structure in which the second substrate structure is inverted; and coupling the first substrate structure and the second substrate structure by hybrid bonding. The first substrate structure includes a first substrate; a first word line, a first bit line, a second bit line, a second word line, a third word line, a third bit line, a fourth bit line, and a fourth word line that are arranged over the first substrate; and first, second, third, and fourth memory cells, the first memory cell being disposed between the first word line and the first bit line, the second memory cell being disposed between the second word line and the second bit line, the third memory cell being disposed between the third word line and the third bit line, and the fourth memory cell being disposed between the fourth word line and the fourth bit line. The first and second word lines, and the first and second bit lines are connected to a first driving circuit included in the first substrate. The third and fourth word lines, and the third and fourth bit lines are connected to a second driving circuit included in the second substrate.

DETAILED DESCRIPTION

Figure 1A:
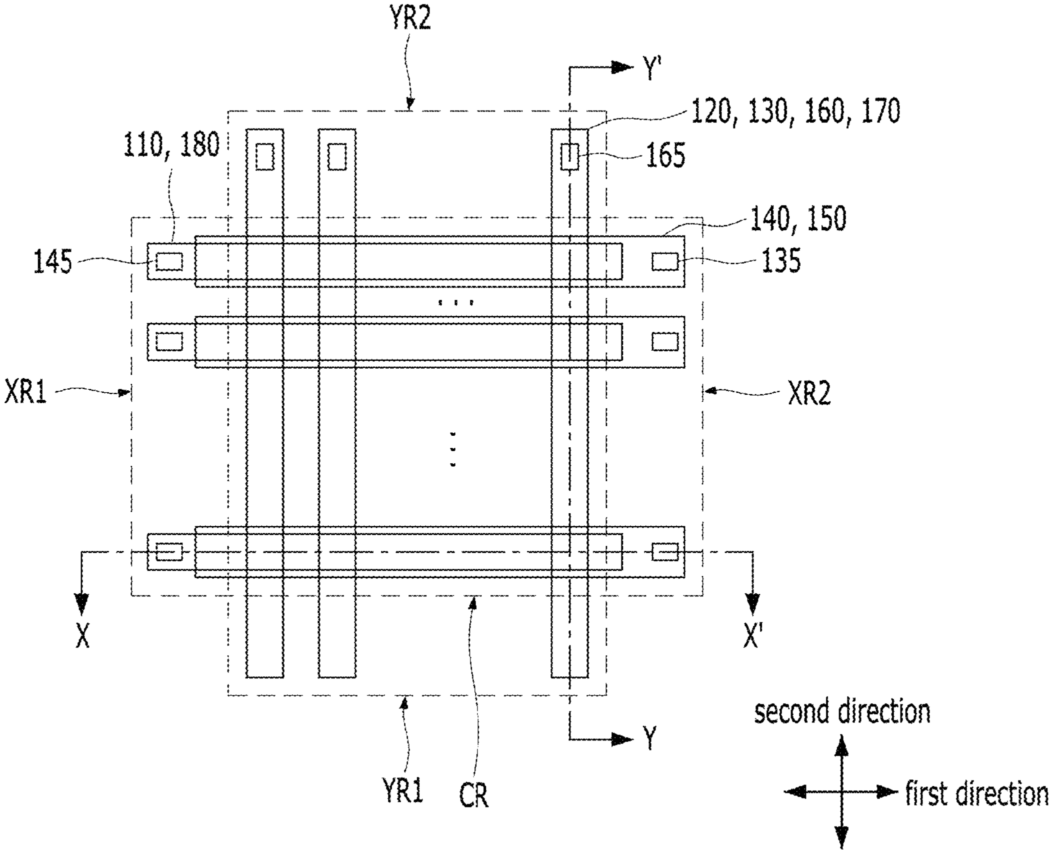
FIG. 1A is a plan view illustrating a first substrate structure according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
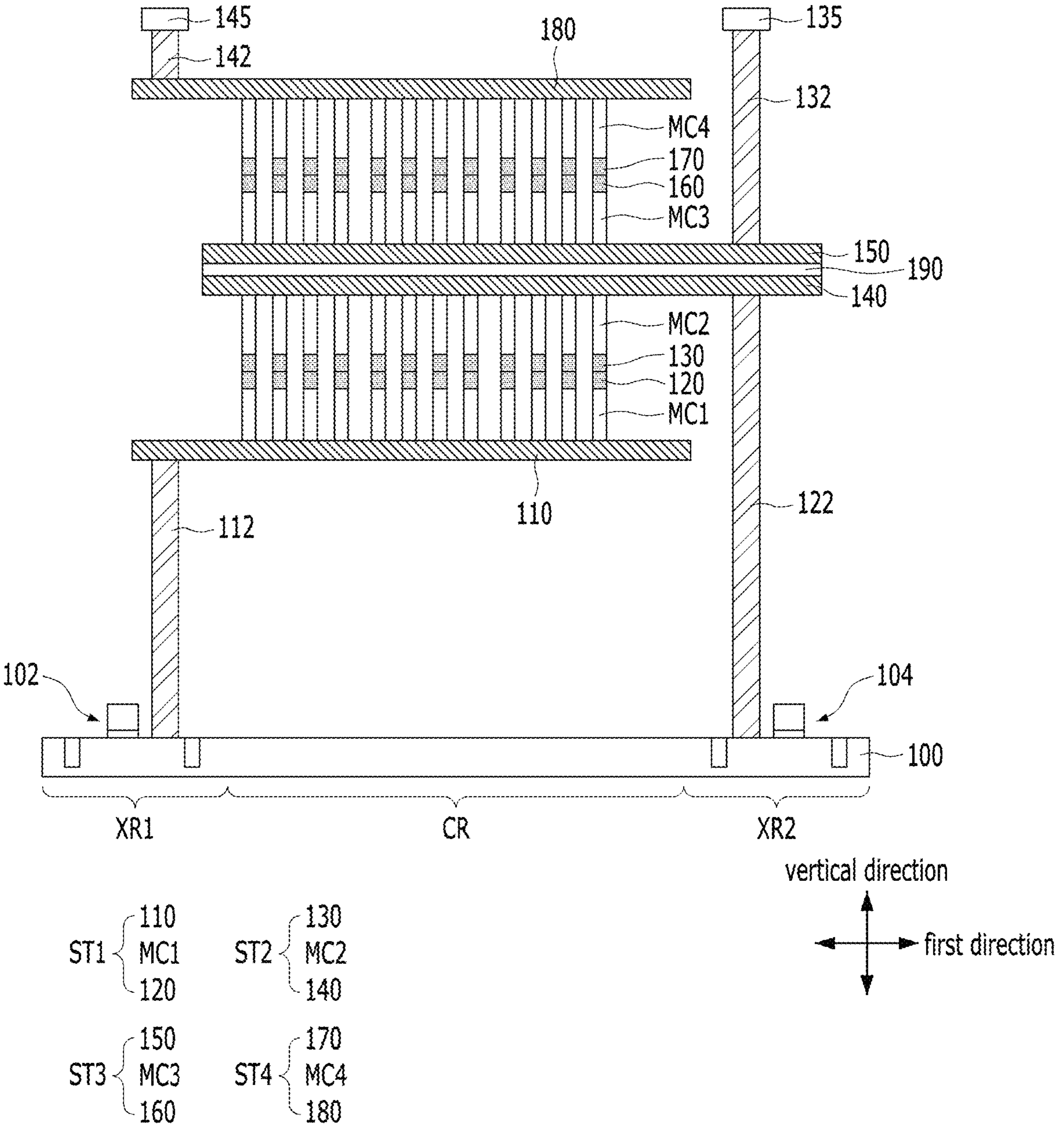
FIG. 1B is a cross-sectional view taken along a line X-X' of FIG. 1A.
Figure 1C:
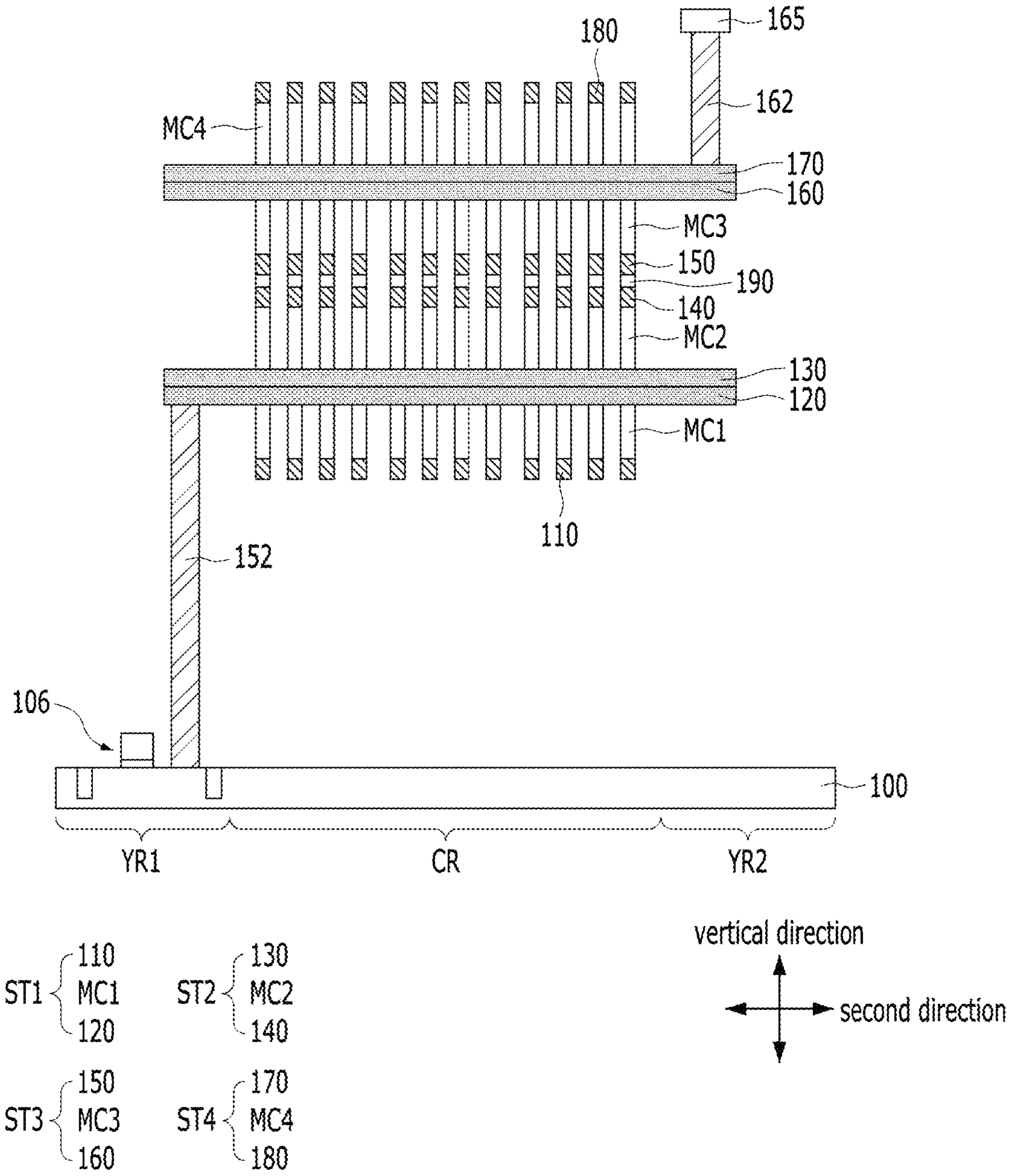
FIG. 1C is a cross-sectional view taken along a line Y-Y' of FIG. 1A.

FIG. 1A is a plan view illustrating a first substrate structure according to an embodiment of the present disclosure, FIG. 1B is a cross-sectional view taken along a line X-X' of FIG. 1A, and FIG. 1C is a cross-sectional view taken along a line Y-Y' of FIG. 1A.

Referring to FIGS. 1A, 1B, and 1C, the first substrate structure of the present embodiment may include a first substrate 100, and four stacked structures ST1, ST2, ST3, and ST4 that are stacked over the first substrate 100 in a specific direction (e.g., a vertical direction). Each of the stacked structures ST1, ST2, ST3, and ST4 may have a cross-point structure. For reference, the vertical direction may correspond to a direction substantially perpendicular to the upper surface of the first substrate 100.

In a plan view, the first substrate structure may include a cell region CR, first and second word line driving circuit regions XR1 and XR2, and first and second bit line driving circuit regions YR1 and YR2. The cell region CR may be a region in which memory cells MC1, MC2, MC3, and MC4 are arranged. The first and second word line driving circuit regions XR1 and XR2 may be a region in which a circuit for driving word lines 110, 140, 150, and 180 is disposed. The first and second bit line driving circuit regions YR1 and YR2 may be a region in which a circuit for driving bit lines 120, 130, 160, and 170 is disposed. The first and second word line driving circuit regions XR1 and XR2 may be disposed at opposite sides of the cell region CR in a first direction, for example, at the left and right sides in a plan view, respectively. The first and second bit line driving circuit regions YR1 and YR2 may be disposed at opposite sides of the cell region CR in a second direction, for example, at the lower and upper sides in a plan view, respectively. Here, the first direction may correspond to a direction parallel to the upper surface of the first substrate 100 and parallel to the X-X' line, and the second direction may correspond to a direction parallel to the upper surface of the first substrate 100 and parallel to the Y-Y' line.

The first substrate 100 may include a semiconductor material such as silicon. Also, the first substrate 100 may include a circuit for driving the first and second word lines 110 and 140, and a circuit for driving the first and second bit lines 120 and 130. For example, a driving circuit of the first word line 110 is shown as a transistor 102 in FIG. 1B, and a driving circuit of the second word line 140 is shown as a transistor 104 in FIG. 1B, and a driving circuit of the first and second bit lines 120 and 130 is shown as a transistor 106 in FIG. 1C. However, embodiments of the present disclosure are not limited thereto, and one or more these driving circuits may be implemented by a combination of various elements. In addition, the driving circuit of the first word line 110 may be disposed in the first word line driving circuit region XR1, the driving circuit of the second word line 140 may be disposed in the second word line driving circuit region XR2, and the driving circuit of the first and second bit lines 120 and 130 may be disposed in the first bit line driving circuit region YR1.

The first stacked structure ST1 may include a plurality of first word lines 110 disposed over the first substrate 100 and extending in the first direction, a plurality of first bit lines 120 disposed over the plurality of first word lines 110 and extending in the second direction intersecting the first direction, and a plurality of first memory cells MC1 disposed between the first word lines 110 and the first bit lines 120 and respectively overlapping intersection regions of the first word lines 110 and the first bit lines 120. Similarly, the second stacked structure ST2 may include a plurality of second bit lines 130 disposed over the plurality of first bit lines 120 and extending in the second direction, a plurality of second word lines 140 disposed over the plurality of second bit lines 130 and extending in the first direction, and a plurality of second memory cells MC2 disposed between the second bit lines 130 and the second word lines 140 and respectively overlapping intersection regions of the second bit lines 130 and the second word lines 140. The third stacked structure ST3 may include a plurality of third word lines 150 disposed over the plurality of second word lines 140 and extending in the first direction, a plurality of third bit lines 160 disposed over the plurality of third word lines 150 and extending in the second direction, and a plurality of third memory cells MC3 disposed between the third word lines 150 and the third bit lines 160 and respectively overlapping intersection regions of the third word lines 150 and the third bit lines 160. The fourth stacked structure ST4 may include a plurality of fourth bit lines 170 disposed over the plurality of third bit lines 160 and extending in the second direction, a plurality of fourth word lines 180 disposed over the plurality of fourth bit lines 170 and extending in the first direction, and a plurality of fourth memory cells MC4 disposed between the fourth bit lines 170 and the fourth word lines 180 and respectively overlapping intersection regions of the fourth bit lines 170 and the fourth word lines 180.

Here, in the width direction of the first to fourth word lines 110, 140, 150, and 180, that is, in the second direction, the first to fourth word lines 110, 140, 150, and 180 may be arranged to overlap each other. For reference, in the plan view of FIG. 1A, the widths of the second and third word lines 140 and 150 are illustrated as being greater than the widths of the first and fourth word lines 110 and 180, but this may be for separating the lines representing the second and third word lines 140 and 150 from the lines representing the first and fourth word lines 110 and 180. The widths of the first to fourth word lines 110, 140, 150, and 180 may not be limited to the illustrated one. That is, although a width of each of the second and third word lines 140 and 150 in the second direction of FIG. 1A is shown to be greater than that of each of the first and fourth word lines 110 and 180, this feature may be merely for clearly distinguishing a solid outline indicating each of the second and third word lines 140 and 150 from that indicating each of the first and fourth word lines 110 and 180. As an example, the widths of the first to fourth word lines 110, 140, 150, and 180 may be substantially equal to each other as shown in the cross-sectional view of FIG. 1C. In addition, in the longitudinal direction of the first to fourth word lines 110, 140, 150, and 180, that is, in the first direction, the first word line 110 and the fourth word line 180 may be disposed to overlap each other, and the second word line 140 and the third word line 150 may be disposed to overlap each other. However, since the first word line 110, the second word line 140, the third word line 150, and the fourth word line 180 are driven independently, the second word line 140 and the third word line 150 may be electrically insulated from each other without contacting each other. To this end, an insulating material 190 may be interposed between the second word line 140 and the third word line 150.

The first and fourth word lines 110 and 180 may extend over at least the first word line driving circuit region XR1 and across the cell region CR. For example, each of the first and fourth word lines 110 and 180 may extend in the first direction to cover the cell region CR and at least a portion of the first word line driving circuit region XR1 when seen in a plan view. This is because the driving circuit of the first word line 110 is disposed in the first word line driving circuit region XR1 of the first substrate structure and the driving circuit of the fourth word line 180 is disposed in the first word line driving circuit region XR1 of a second substrate structure (e.g., second substrate structure in FIGS. 2A to 2C) to be described later. In the embodiment of FIG. 1B, the first and fourth word lines 110 and 180 extend to partially overlap the second word line driving circuit region XR2, but embodiments of the present disclosure are not limited thereto. In another embodiment, the first and fourth word lines 110 and 180 may not overlap the second word line driving circuit region XR2. Similarly, the second and third word lines 140 and 150 may extend across the cell region CR and over at least the second word line driving circuit region XR2. This is because the driving circuit of the second word line 140 is disposed in the second word line driving circuit region XR2 of the first substrate structure and the driving circuit of the third word line 150 is disposed in the second word line driving circuit region XR2 of the second substrate structure to be described later. In the embodiment of FIG. 1B, the second and third word lines 140 and 150 extend to partially overlap the first word line driving circuit region XR1, but embodiments of the present disclosure are not limited thereto. In another embodiment, the second and third word lines 140 and 150 may not overlap the first word line driving circuit region XR1.

Each of the plurality of first word lines 110 may be connected to the driving circuit of the first word line 110 of the first word line driving circuit region XR1 through a first contact structure 112 disposed therebelow. For example, as shown in the cross-sectional view of FIG. 1B, the first contact structure 112 may have an upper surface that is connected to the lower surface of the first word line 110 and a lower surface that is connected to a junction region of the transistor 102, and thus the first word line 110 may be electrically connected to the transistor 102. For reference, a contact structure (e.g., the first contact structure 112) may refer to a structure that electrically connects components disposed thereunder and thereover by extending in a specific direction (e.g., the vertical direction) and having conductivity. The contact structure may include a single pattern, or a plurality of patterns stacked in the vertical direction. Although the cross-sectional view of FIG. 1B illustrates that the first contact structure 112 is formed of a single contact plug, embodiments of the present disclosure are not limited thereto. The first contact structure 112 may include two or more contact plugs, or a combination of one or more contact plugs and one or more contact pads. Although the first contact structure 112 is not illustrated in the plan view of FIG. 1A for convenience of description, the first contact structure 112 may be disposed to overlap each of the plurality of first word lines 110 in the first word line driving circuit region XR1, similarly to first bonding pad 145 to be described later.

Each of the plurality of second word lines 140 may be connected to the driving circuit of the second word line 140 of the second word line driving circuit region XR2 through a second contact structure 122 disposed therebelow. For example, as shown in the cross-sectional view of FIG. 1B, the second contact structure 122 may have an upper surface that is connected to the lower surface of the second word line 140 and a lower surface that is connected to a junction region of the transistor 104, and thus the second word line 140 may be electrically connected to the transistor 104. Although the cross-sectional view of FIG. 1B illustrates that the second contact structure 122 is formed of a single contact plug, embodiments of the present disclosure are not limited thereto. The second contact structure 122 may include two or more contact plugs, or a combination of one or more contact plugs and one or more contact pads. Although the second contact structure 122 is not illustrated in the plan view of FIG. 1A for convenience of description, the second contact structure 122 may be disposed to overlap each of the plurality of second word lines 140 in the second word line driving circuit region XR2, similarly to second bonding pad 135 to be described later.

Each of the plurality of third word lines 150 may be connected to the second bonding pad 135 through a third contact structure 132 disposed thereover, and through this, it may be connected to the driving circuit of the third word line 150 of the second substrate structure to be described later. Connection with the second substrate structure will be described in more detail in the corresponding part of the present disclosure. For example, as shown in the cross-sectional view of FIG. 1B, the third contact structure 132 may have a lower surface that is connected to the upper surface of the third word line 150 and an upper surface that is connected to the second bonding pad 135, and thus the third word line 150 may be electrically connected to the second bonding pad 135. Although the cross-sectional view of FIG. 1B illustrates that the third contact structure 132 is formed of a single contact plug, embodiments of the present disclosure are not limited thereto. The third contact structure 132 may include two or more contact plugs, or a combination of one or more contact plugs and one or more contact pads. Although the third contact structure 132 is not illustrated in the plan view of FIG. 1A for convenience of description, the third contact structure 132 may be disposed to overlap each second bonding pad 135.

Each of the plurality of fourth word lines 180 may be connected to the first bonding pad 145 through a fourth contact structure 142 disposed thereover, and through this, it may be connected to the driving circuit of the fourth word line 180 of the second substrate structure to be described later. Connection with the second substrate structure will be described in more detail in the corresponding part of the present disclosure. For example, as shown in the cross-sectional view of FIG. 1B, the fourth contact structure 142 may have a lower surface that is connected to the upper surface of the fourth word line 180 and an upper surface that is connected to the first bonding pad 145, and thus the fourth word line 180 may be electrically connected to the first bonding pad 145. Although the cross-sectional view of FIG. 1B illustrates that the fourth contact structure 142 is formed of a single contact plug, embodiments of the present disclosure are not limited thereto. The fourth contact structure 142 may include two or more contact plugs, or a combination of one or more contact plugs and one or more contact pads. Although the fourth contact structure 142 is not illustrated in the plan view of FIG. 1A for convenience of description, the fourth contact structure 142 may be disposed to overlap each first bonding pad 145.

In the width direction of the first to fourth bit lines 120, 130, 160, and 170, that is, in the first direction, the first to fourth bit lines 120, 130, 160, and 170 may be disposed to overlap each other. In addition, in the longitudinal direction of the first to fourth bit lines 120, 130, 160, and 170, that is, in the second direction, the first and second bit lines 120 and 130 may be disposed to overlap and contact each other, and the third and fourth bit lines 160 and 170 may be disposed to overlap and contact each other. Accordingly, the first bit line 120 and the second bit line 130 may be electrically connected with each other to be driven as a single line, and the third bit line 160 and the fourth bit line 170 may be electrically connected with each other to be driven as a single line. That is, the first and second bit lines 120 and 130 may function as a common bit line of the first stacked structure ST1 and the second stacked structure ST2, and the third and fourth bit lines 160 and 170 may function as a common bit line of the third stacked structure ST3 and the fourth stacked structure ST4. In the embodiment of FIGS. 1A to 1C, direct contact between the first bit line 120 and the second bit line 130 is illustrated. However, in another embodiment, a conductive material may be interposed between the first bit line 120 and the second bit line 130 to electrically connect the first bit line 120 and the second bit line 130 with each other. Similarly, in the embodiment of FIGS. 1B and 1C, direct contact between the third bit line 160 and the fourth bit line 170 is illustrated. However, in another embodiment, a conductive material may be interposed between the third bit line 160 and the fourth bit line 170 to electrically connect the third bit line 160 and the fourth bit line 170 with each other.

The first and second bit lines 120 and 130 may extend over at least the first bit line driving circuit region YR1 and across the cell region CR. This is because the driving circuit of the first and second bit lines 120 and 130 is disposed in the first bit line driving circuit region YR1. In the embodiment of FIGS. 1A to 1C, the first and second bit lines 120 and 130 extend to partially overlap the second bit line driving circuit region YR2, but embodiments of the present disclosure are not limited thereto. In another embodiment, the first and second bit lines 120 and 130 may not overlap the second bit line driving circuit region YR2. The third and fourth bit lines 160 and 170 may extend over at least the second bit line driving circuit region YR2 and across the cell region CR. This is because the driving circuit of the third and fourth bit lines 160 and 170 is disposed in the second bit line driving circuit region YR2 of the second substrate structure to be described later. In the embodiment of FIGS. 1A to 1C, the third and fourth bit lines 160 and 170 extend to partially overlap the first bit line driving circuit region YR1, but embodiments of the present disclosure are not limited thereto. In another embodiment, the third and fourth bit lines 160 and 170 may not overlap the first bit line driving circuit region YR1.

Each of the plurality of first bit lines 120 may be connected to the driving circuit of the first and second bit lines 120 and 130 of the first bit line driving circuit region YR1 through a fifth contact structure 152 disposed therebelow. For example, as shown in the cross-sectional view of FIG. 1C, the fifth contact structure 152 may have an upper surface that is connected to the lower surface of the first bit line 120 and a lower surface that is connected to a junction region of the transistor 106, and thus the first bit line 120 may be electrically connected to the transistor 106. Although the cross-sectional view of FIG. 1C illustrates that the fifth contact structure 152 is formed of a single contact plug, embodiments of the present disclosure are not limited thereto. The fifth contact structure 152 may include two or more contact plugs, or a combination of one or more contact plugs and one or more contact pads. Although the fifth contact structure 152 is not illustrated in the plan view of FIG. 1A for convenience of description, the fifth contact structure 152 may be disposed to overlap each of the plurality of first bit lines 120 in the first bit line driving circuit region YR1.

Each of the plurality of fourth bit lines 170 may be connected to the third bonding pad 165 through a sixth contact structure 162 disposed thereover, and through this, it may be connected to the driving circuit of the third and fourth bit lines 160 and 170 of the second substrate structure to be described later. Connection with the second substrate structure will be described in more detail in the corresponding part of the present disclosure. For example, as shown in the cross-sectional view of FIG. 1C, the sixth contact structure 162 may have a lower surface that is connected to the upper surface of the fourth bit line 170 and an upper surface that is connected to the third bonding pad 165, and thus the fourth bit line 170 may be electrically connected to the third bonding pad 165. Although the cross-sectional view of FIG. 1C illustrates that the sixth contact structure 162 is formed of a single contact plug, embodiments of the present disclosure are not limited thereto. The sixth contact structure 162 may include two or more contact plugs, or a combination of one or more contact plugs and one or more contact pads. Although the sixth contact structure 162 is not illustrated in the plan view of FIG. 1A for convenience of description, the sixth contact structure 162 may be disposed to overlap each third bonding pad 165.

Each of the first to fourth word lines 110, 140, 150, and 180 and the first to fourth bit lines 120, 130, 160, and 170 may be formed of one or more various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof.

The first memory cell MC1 may be disposed at an intersection region of the first word line 110 and the first bit line 120, and may store different data according to a voltage or current applied through the first word line 110 and the first bit line 120. Since the first word lines 110 and the first bit lines 120 cross each other in the cell region CR, a plurality of first memory cells MC1 may be arranged in the cell region CR. As an example, the first memory cell MC1 may include a variable resistance element that stores different data by switching between different resistance states according to a voltage or current applied through the first word line 110 and the first bit line 120. As an example, the first memory cell MC1 may include a layer structure as illustrated in FIG. 4.

Figure 4:
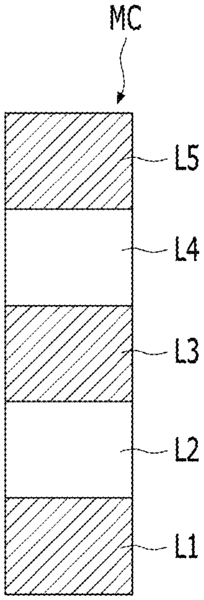
FIG. 4 is a cross-sectional view illustrating a memory cell according to an embodiment of the present disclosure.

FIG. 4 is a cross-sectional view illustrating a memory cell according to an embodiment of the present disclosure.

Referring to FIG. 4, a memory cell MC may include a multilayer structure including a lower electrode layer L1, a selector layer L2, an intermediate electrode layer L3, a variable resistance layer L4, and an upper electrode layer L5.

The lower electrode layer L1 and the upper electrode layer L5 may be respectively positioned at the lower end and upper end of the memory cell MC to transmit a voltage or current required for an operation of the memory cell MC. The intermediate electrode layer L3 may function to electrically connect the selector layer L2 and the variable resistance layer L4 while physically separating them. Each of the lower electrode layer L1, the intermediate electrode layer L3, and the upper electrode layer L5 may include one or more various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, one or more of the lower electrode layer L1, the intermediate electrode layer L3, and the upper electrode layer L5 may include a carbon electrode.

The selector layer L2 may function to prevent or reduce current leakage that may occur between the memory cells MC sharing a word line or a bit line. To this end, the selector layer L2 may have a threshold switching characteristic in which current flow is substantially blocked when the applied voltage is less than a predetermined threshold value, and current flow rapidly increases when the applied voltage is exceeds a predetermined threshold value. This threshold value may be referred to as a threshold voltage, and the selector layer L2 may be implemented in a turned-on state, or a turned-off state based on the threshold voltage. The selector layer L2 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$ or $VO_2$, a tunneling insulating layer having a relatively wide band gap, such as $SiO_2$ or $Al_2O_3$, or the like.

The variable resistance layer L4 may be a part serving to store data in the memory cell MC. To this end, the variable resistance layer L4 may have a variable resistance characteristic that switches between different resistance states according to an applied voltage. The variable resistance layer L4 may have a single-layer structure or a multi-layer structure, and include one or more various materials used in RRAM, PRAM, FRAM, MRAM, or the like, for example, a metal oxide such as a transition metal oxide or a perovskite-based material, a phase change material such as a chalcogenide-based material, a ferroelectric material, a ferromagnetic material, or the like.

However, the layer structure of the memory cell MC is not limited to the embodiment shown in FIG. 4. When the memory cell MC includes a variable resistance element (e.g., the variable resistance layer L4) essential for data storage, the stacking order of the layers may be changed or at least one of the stacked layers may be omitted. As an example, one or more of the lower electrode layer L1, the selector layer L2, the intermediate electrode layer L3, and the upper electrode layer L5 may be omitted, or the positions of the selector layer L2 and the variable resistance layer L4 may be reversed with each other. Alternatively, one or more layers (not shown) may be added to the memory cell MC to improve a process or improve characteristics of the memory cell MC. Alternatively, the memory cell MC may correspond to a self-selecting memory cell including a layer that is disposed between the lower electrode layer L1 and the upper electrode layer L5 and functions as a memory element and as a selector at the same time.

Referring back to FIGS. 1A to 1C, the first memory cell MC may have a quadrangular pillar shape that has both sidewalls aligned with both sidewalls of the first bit line 120 in the first direction and both sidewalls aligned with both sidewalls of the first word line 110 in the second direction. However, embodiments of the present disclosure are not limited thereto. As long as the first memory cell MC overlaps the intersection region of the first word line 110 and the first bit line 120 and is separated from the adjacent first memory cell MC, the first memory cell MC may have various pillar shapes according to embodiments.

Each of second to fourth memory cells MC2, MC3, and MC4 may have substantially the same arrangement, shape, and layer structure as the first memory cell MC1, and thus a detailed description thereof will be omitted for the interest of brevity.

The first bonding pad 145 may be disposed to overlap each fourth word line 180 in the first word line driving circuit region XR1, and may be electrically connected to the fourth word line 180 through the fourth contact structure 142. The second bonding pad 135 may be disposed to overlap each third word line 150 in the second word line driving circuit region XR2, and may be electrically connected to the third word line 150 through the third contact structure 132. The third bonding pad 165 may be disposed to overlap each fourth bit line 170 in the second bit line driving circuit region YR2, and may be electrically connected to the fourth bit line 170 through the sixth contact structure 162. The first bonding pad 145, the second bonding pad 135, and the third bonding pad 165 may be positioned at substantially the same level in the vertical direction. In other words, they may be located at substantially the same distance from the upper surface of the first substrate 100 in the vertical direction. For example, a difference between a first distance from the upper surface of the first substrate 100 to an upper surface of the first bonding pad 145 in the vertical direction and a second distance from the upper surface of the first substrate 100 to an upper surface of the second bonding pad 135 in the vertical direction may be equal to or less than 5%, 3%, or 1% of an average of the first distance and the second distance. In addition, the first bonding pad 145, the second bonding pad 135, and the third bonding pad 165 may be bonded to bonding pads of the second substrate structure to be described later to form a hybrid-bonding structure. For this, the first bonding pad 145, the second bonding pad 135, and the third bonding pad 165 may include a first metal material that can be bonded to a second metal material by the interdiffusion between the first metal material and the second metal material through a high-temperature annealing process, the first metal material being the same as or different from the second metal material. As an example, the first bonding pad 145, the second bonding pad 135, and the third bonding pad 165 may include a metal such as copper (Cu), nickel (Ni), tin (Sn), gold (Au), or silver (Ag), a combination thereof, or a compound thereof.

Although not shown, the remaining spaces other than those occupied by the components shown over the substrate 100 may be filled with an insulating material. In particular, an insulating material positioned at substantially the same level as the first bonding pad 145, the second bonding pad 135, and the third bonding pad 165 in the vertical direction and filling the spaces therebetween may be suitable for forming a hybrid bonding structure by being directly bonded to an insulating material of the second substrate structure to be described later. The insulating material positioned at substantially the same level as the first bonding pad 145, the second bonding pad 135, and the third bonding pad 165 may include a material capable of bonding between insulating materials by covalent bonding, for example, silicon oxide, silicon nitride, or a combination thereof.

Figure 2A:
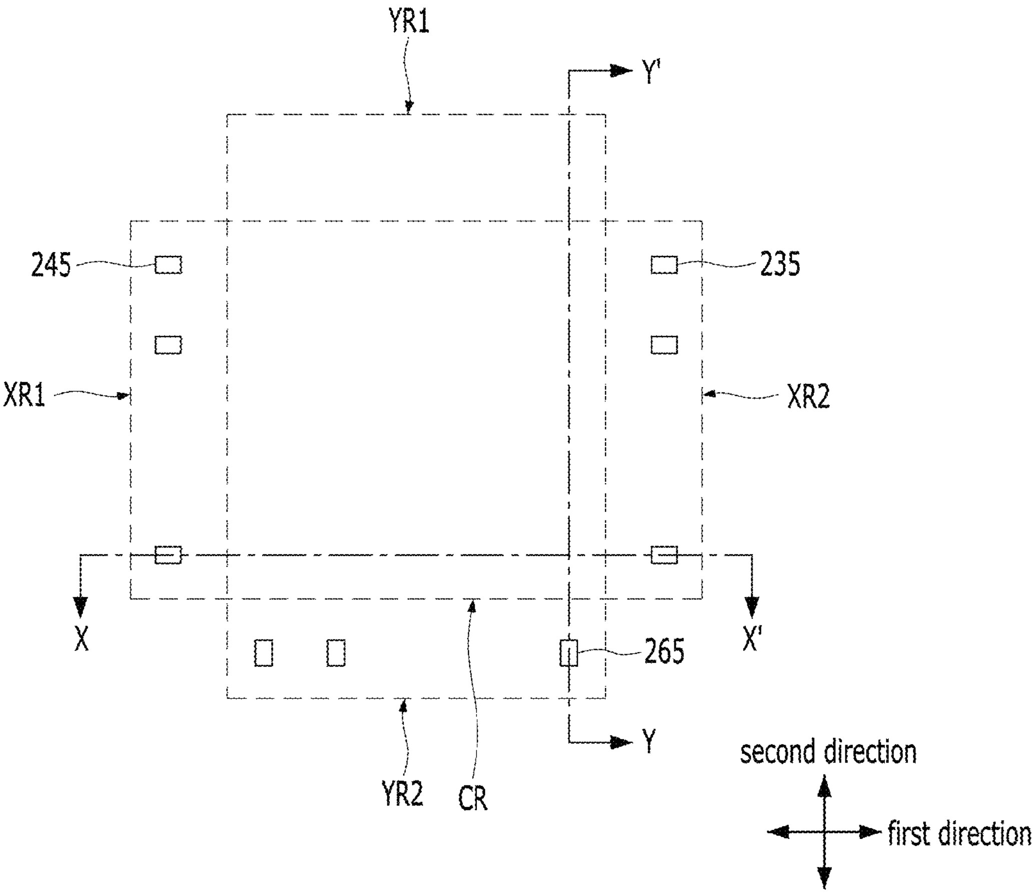
FIG. 2A is a plan view illustrating a second substrate structure according to an embodiment of the present disclosure.
Figure 2B:
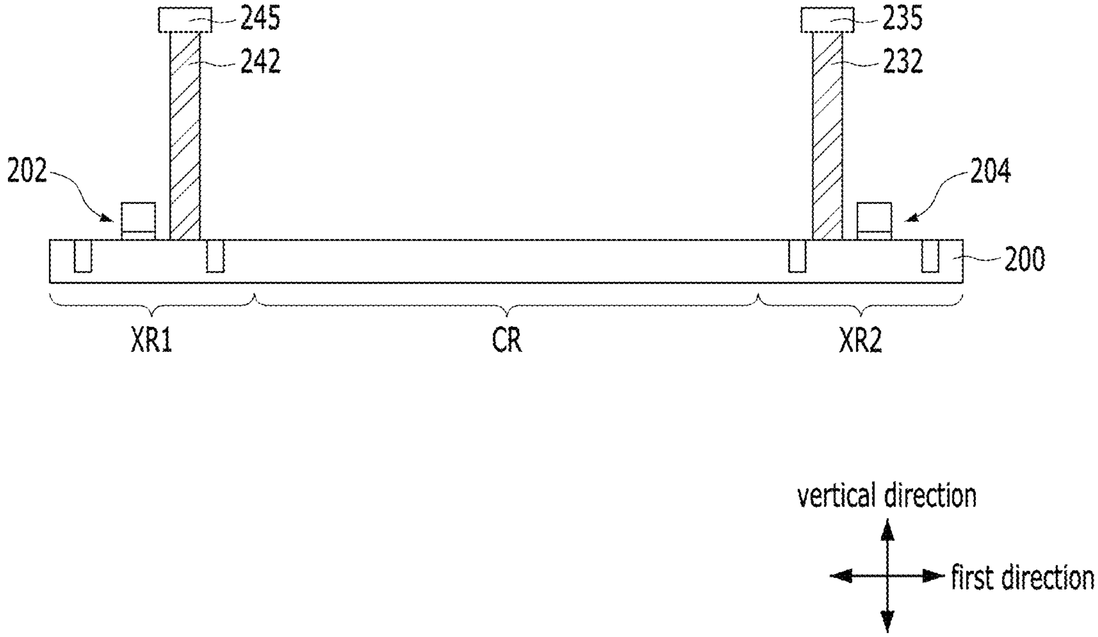
FIG. 2B is a cross-sectional view taken along a line X-X' of FIG. 2A.
Figure 2C:
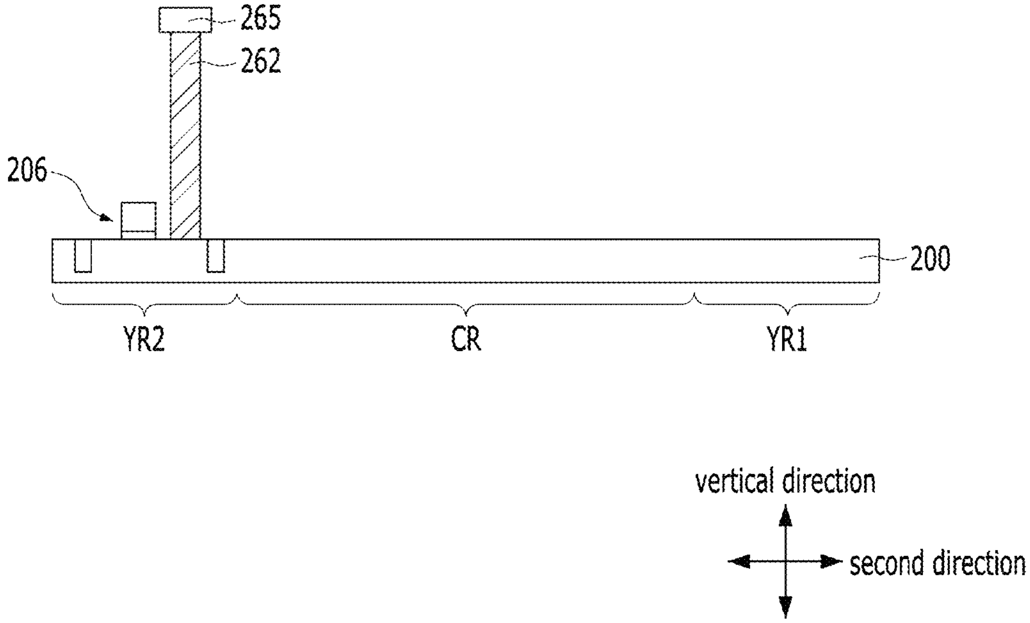
FIG. 2C is a cross-sectional view taken along a line Y-Y' of FIG. 2A.

FIG. 2A is a plan view illustrating a second substrate structure according to an embodiment of the present disclosure, FIG. 2B is a cross-sectional view taken along a line X-X' of FIG. 2A, and FIG. 2C is a cross-sectional view taken along a line Y-Y' of FIG. 2A.

Referring to FIGS. 2A, 2B, and 2C, the second substrate structure may include a second substrate 200, seventh to ninth contact structures 242, 232, and 262 that are disposed over the second substrate 200, and fourth to sixth bonding pads 245, 235, and 265 that are disposed over the seventh to ninth contact structures 242, 232, and 262, respectively.

In a plan view, the second substrate structure may include a cell region CR, first and second word line driving circuit regions XR1 and XR2, and first and second bit line driving circuit regions YR1 and YR2. The cell region CR, the first and second word line driving circuit regions XR1 and XR2, and the first and second bit line driving circuit regions YR1 and YR2 of the second substrate structure may respectively overlap the cell region CR, the first and second word line driving circuit regions XR1 and XR2, and the first and second bit line driving circuit regions YR1 and YR2 of the first substrate structure. For this reason, in each of the first and second substrate structures, the cell region CR, the first and second word line driving circuit regions XR1 and XR2, and the first and second bit line driving circuit regions YR1 and YR2 are denoted by the same reference numerals.

However, as will be described later with reference to FIGS. 3A to 3C, the second substrate structure may be disposed to be upside down when bonding to the first substrate structure so that the upper surface of the second substrate 200 faces the upper surface of the first substrate 100. As an example, the second substrate structure may be disposed over the first substrate structure while being rotated by 180 degrees about an axis in the first direction. Accordingly, as shown in FIGS. 2A to 2C, in the second substrate structure before rotation, the first and second word line driving circuit regions XR1 and XR2 may be disposed at opposite sides of the cell region CR in the first direction, for example, at left and right sides of the cell region CR, respectively, and the first and second bit line driving circuit regions YR1 and YR2 may be disposed at opposite sides of the cell region CR in the second direction, for example, at upper and lower sides of the cell region CR, respectively. That is, compared to the first substrate structure, the positions of the first and second word line driving circuit regions XR1 and XR2 are the same, while the positions of the first and second bit line driving circuit regions YR1 and YR2 may be reversed. However, embodiments of the present disclosure are not limited thereto, and the second substrate structure may be disposed over the first substrate structure while being rotated by 180 degrees about an axis in the second direction. In this case, compared to the first substrate structure, the positions of the first and second bit line driving circuit regions YR1 and YR2 are the same, while the positions of the first and second word line driving circuit regions XR1 and XR2 may be reversed.

The second substrate 200 may include circuits for driving the third and fourth word lines 150 and 180, and the third and fourth bit lines 160 and 170. For example, a driving circuit of the fourth word line 180 is shown as a transistor 202 in FIG. 2B, a driving circuit of the third word line 150 is shown as a transistor 204 in FIG. 2B, and a driving circuit of the third and fourth bit lines 160 and 170 is shown as transistor 206 in FIG. 2C. However, embodiments of the present disclosure are not limited thereto, and such a driving circuit may be implemented by a combination of various elements. In addition, the driving circuit of the fourth word line 180 may be disposed in the first word line driving circuit region XR1, the driving circuit of the third word line 150 may be disposed in the second word line driving circuit region XR2, and the driving circuit of the third and fourth bit lines 160 and 170 may be disposed in the second bit line driving circuit region YR2.

No electrical components may be disposed over the second substrate 200 in the cell region CR. That is, the space over the substrate 200 of the cell region CR may be filled with an insulating material.

A seventh contact structure 242 connected to the driving circuit of the fourth word line 180 may be disposed over the second substrate 200 in the first word line driving circuit region XR1. For example, as shown in the cross-sectional view of FIG. 2B, the seventh contact structure 242 may have a lower surface that is connected to a junction region of the transistor 202, and thus may be electrically connected to the transistor 202. Although the cross-sectional view of FIG. 2B illustrates that the seventh contact structure 242 is formed of a single contact plug, embodiments of the present disclosure are not limited thereto. The seventh contact structure 242 may include two or more contact plugs, or a combination of one or more contact plugs and one or more contact pads. Although the seventh contact structure 242 is not illustrated in the plan view of FIG. 2A for convenience of description, it may be disposed to overlap each fourth bonding pad 245.

An eighth contact structure 232 connected to the driving circuit of the third word line 150 may be disposed over the second substrate 200 in the second word line driving circuit region XR2. For example, as shown in the cross-sectional view of FIG. 2B, the eighth contact structure 232 may have a lower surface that is connected to a junction region of the transistor 204, and thus may be electrically connected to the transistor 204. Although the cross-sectional view of FIG. 2B illustrates that the eighth contact structure 232 is formed of a single contact plug, embodiments of the present disclosure are not limited thereto. The eighth contact structure 232 may include two or more contact plugs, or a combination of one or more contact plugs and one or more contact pads. Although the third contact structure 232 is not illustrated in the plan view of FIG. 2A for convenience of description, it may be disposed to overlap each fifth bonding pad 235.

A ninth contact structure 262 connected to the driving circuit of the third and fourth bit lines 160 and 170 may be disposed over the second substrate 200 in the second bit line driving circuit region YR2. For example, as shown in the cross-sectional view of FIG. 2C, the ninth contact structure 262 may have a lower surface that is connected to a junction region of the transistor 206, and thus may be electrically connected to the transistor 206. Although the cross-sectional view of FIG. 2C illustrates that the ninth contact structure 262 is formed of a single contact plug, embodiments of the present disclosure are not limited thereto. The ninth contact structure 262 may include two or more contact plugs, or a combination of one or more contact plugs and one or more contact pads. Although the ninth contact structure 262 is not illustrated in the plan view of FIG. 2A for convenience of description, it may be disposed to overlap each sixth bonding pad 265.

The fourth bonding pad 245 may have a lower surface in contact with the upper surface of the seventh contact structure 242, and may be disposed to overlap each first bonding pad 145 of the first substrate structure in the first word line driving circuit region XR1. For example, when the second substrate structure rotates by 180 degrees about the axis in the first direction to form a bonding structure with the first substrate structure, the fourth bonding pad 245 may be disposed to overlap the first bonding pad 145 of the first substrate structure in the first word line driving circuit region XR1. The fifth bonding pad 235 may have a lower surface in contact with the upper surface of the eighth contact structure 232, and may be disposed to overlap each second bonding pad 135 of the first substrate structure in the second word line driving circuit region XR2. The sixth bonding pad 265 may have a lower surface in contact with the upper surface of the ninth contact structure 262, and may be disposed to overlap the third bonding pad 165 of the first substrate structure in the second bit line driving circuit region YR2. The fourth bonding pad 245, the fifth bonding pad 235, and the sixth bonding pad 265 may be positioned at substantially the same level in the vertical direction. That is, the distance from the upper surface of the second substrate 200 to each of the fourth bonding pad 245, the fifth bonding pad 235, and the sixth bonding pad 265 in the vertical direction may be constant. In addition, the fourth bonding pad 245, the fifth bonding pad 235, and the sixth bonding pad 265 may be directly bonded to first bonding pad 145, the second bonding pad 135, and the third bonding pad 165 of the first substrate structure, respectively, to form a hybrid bonding structure. The fourth bonding pad 245, the fifth bonding pad 235, and the sixth bonding pad 265 may include the same material as the first bonding pad 145, the second bonding pad 135, and the third bonding pad 165, respectively.

Although not shown, the remaining spaces other than those occupied by the components shown over the substrate 200 may be filled with an insulating material. In particular, an insulating material positioned at substantially the same level as the fourth bonding pad 245, the fifth bonding pad 235, and the sixth bonding pad 265 in the vertical direction and filling the spaces therebetween may be directly bonded to the insulating material of the first substrate structure to form a hybrid bonding structure, and may include the same material as the insulating material of the first substrate structure.

Figure 3A:
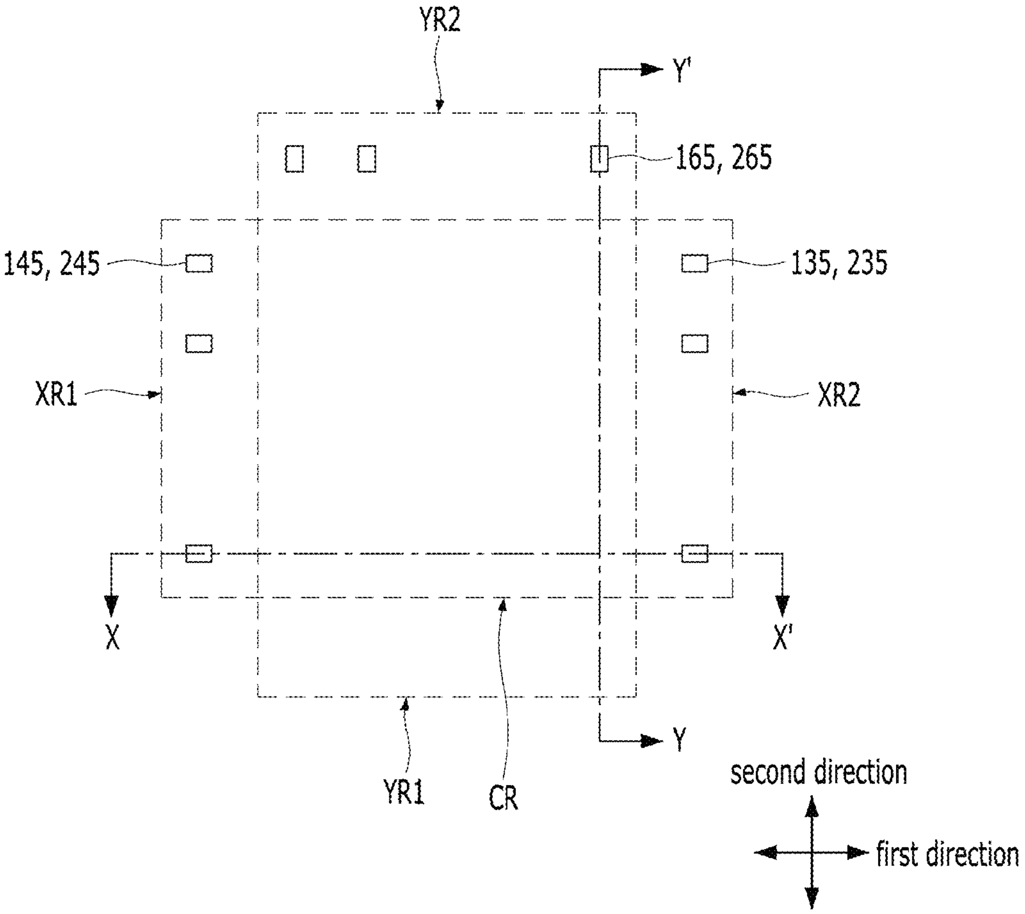
FIG. 3A is a plan view illustrating a semiconductor device according to an embodiment of the present disclosure.
Figure 3B:
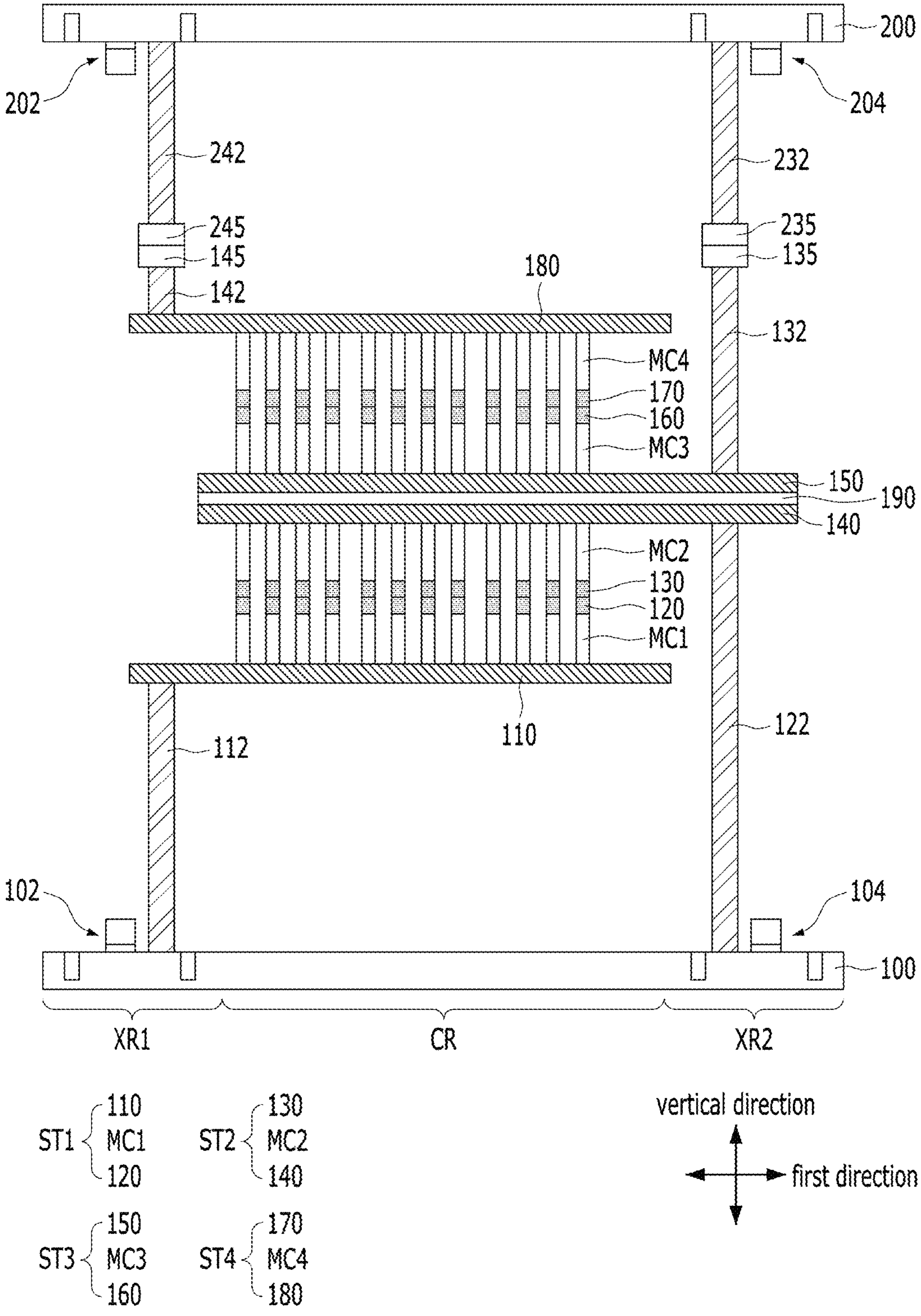
FIG. 3B is a cross-sectional view taken along a line X-X' of FIG. 3A.
Figure 3C:
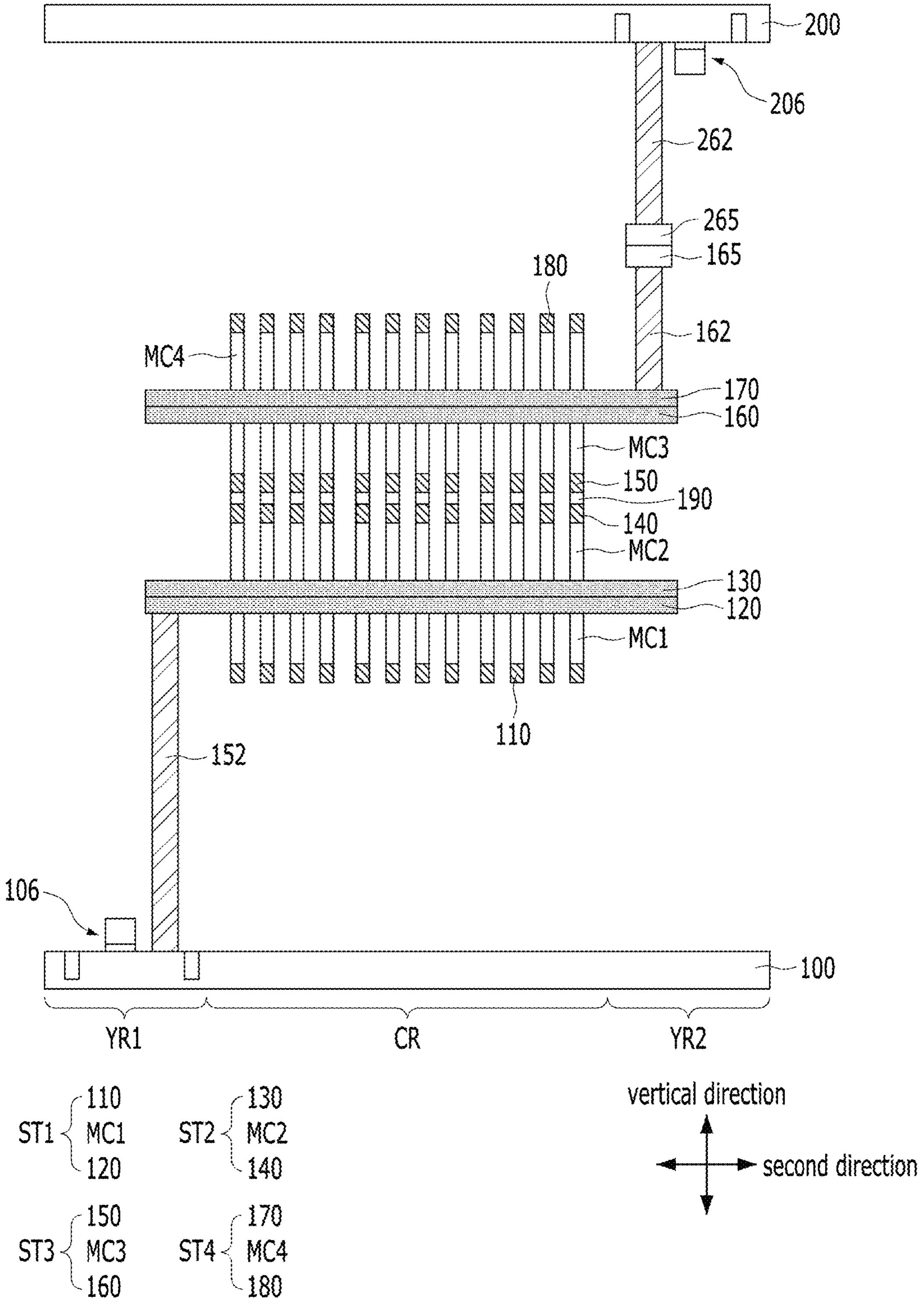
FIG. 3C is a cross-sectional view taken along line a Y-Y' of FIG. 3A.

FIG. 3A is a plan view illustrating a semiconductor device according to an embodiment of the present disclosure, FIG. 3B is a cross-sectional view taken along a line X-X' of FIG. 3A, and FIG. 3C is a cross-sectional view taken along line a Y-Y' of FIG. 3A.

For convenience of description, in the plan view of FIG. 3A, only the bonding pads are shown with solid lines, and word lines and bit lines are omitted.

Referring to FIGS. 3A to 3C, a semiconductor device according to an embodiment may be formed by bonding the first substrate structure of FIGS. 1A to 1C and the second substrate structure of FIGS. 2B to 2C to each other.

More specifically, the second substrate structure may be disposed over the first substrate structure in a state in which the second substrate structure is inverted, the first bonding pad 145 and the fourth bonding pad 245 overlap each other, the second bonding pad 135 and the fifth bonding pad 235 overlap each other, and the third bonding pad 165 and the sixth bonding pad 265 overlap each other. The first substrate structure and the second substrate structure may be coupled by hybrid bonding. During the hybrid bonding, bonding by interdiffusion of metals may be made between the first bonding pad 145 and the fourth bonding pad 245, between the second bonding pad 135 and the fifth bonding pad 235, and between the third bonding pad 165 and the sixth bonding pad 265. In addition, although not shown, during the hybrid bonding, the insulating material between the first bonding pad 145, the second bonding pad 135, and the third bonding pad 165 may be bonded to the insulating material between the fourth bonding pad 245, the fifth bonding pad 235, and the sixth bonding pad 265 by a covalent bond.

In such a semiconductor device, the first stacked structure ST1 to the fourth stacked structure ST4 may be disposed in the first substrate structure, but the circuits for driving the first and second stacked structures ST1 and ST2 may be formed in the first substrate 100 of the first substrate structure and the circuits for driving the third and fourth stacked structures ST3 and ST4 may be formed in the second substrate 200 of the second substrate structure. Since the driving circuit of the first word line 110 and the driving circuit of the fourth word line 180 are respectively formed in the first substrate 100 and the second substrate 200, and are disposed in the first word line driving circuit region XR1 outside the cell region CR, the area of the cell region CR may be reduced compared to a case in which driving circuit region is positioned in the cell region CR. Similarly, since the driving circuit of the second word line 140 and the driving circuit of the third word line 150 are respectively formed in the first substrate 100 and the second substrate 200, and are disposed in the second word line driving circuit region XR2 outside the cell region CR, the area of the cell region CR may be reduced compared to a case in which the driving circuit region is positioned in the cell region CR. Similarly, the driving circuit of the first and second bit lines 120 and 130 and the driving circuit of the third and fourth bit lines 160 and 170 are respectively formed in the first substrate 100 and the second substrate 200, and are respectively disposed in the first bit line driving circuit region YR1 and the second bit line driving circuit region YR2 outside the cell region CR, the area of the cell region CR may be reduced compared to a case in which the driving circuit region is positioned in the cell region CR. For example, by disposing driving circuits within first and second substrates that are disposed below and over memory cells in a cell region, respectively, and in regions adjacent to the cell region, overlapped portions between the word lines 110, 140, 150, and 180 may be increased compared to those between corresponding word lines in a conventional semiconductor device including all the driving circuits in a single substrate in its cell region. Similarly, overlapped portions between the bit lines 120, 130, 160, and 170 in the semiconductor device according to an embodiment of the present disclosure may be increased compared to those between corresponding bit lines in the conventional semiconductor device. Thus, a cell region of the semiconductor device according to an embodiment may be reduced compared to that of the conventional semiconductor device. As a result, the total area of the semiconductor device may be reduced. Furthermore, since the driving circuit of the first word line 110 and the driving circuit of the fourth word line 180 are located in the first word line driving circuit region XR1 overlapping each other in the first and second substrate structures, and the driving circuit of the second word line 140 and the driving circuit of the third word line 150 are located in the second word line driving circuit region XR2 overlapping each other in the first and second substrate structures, the area of the semiconductor device may be further reduced.

Since the specific connection relationship between the components in the semiconductor device according to an embodiment of the present disclosure has already been described with reference to FIGS. 1A to 2C, a detailed description thereof will be omitted herein for the interest of brevity.

Figure 5A:
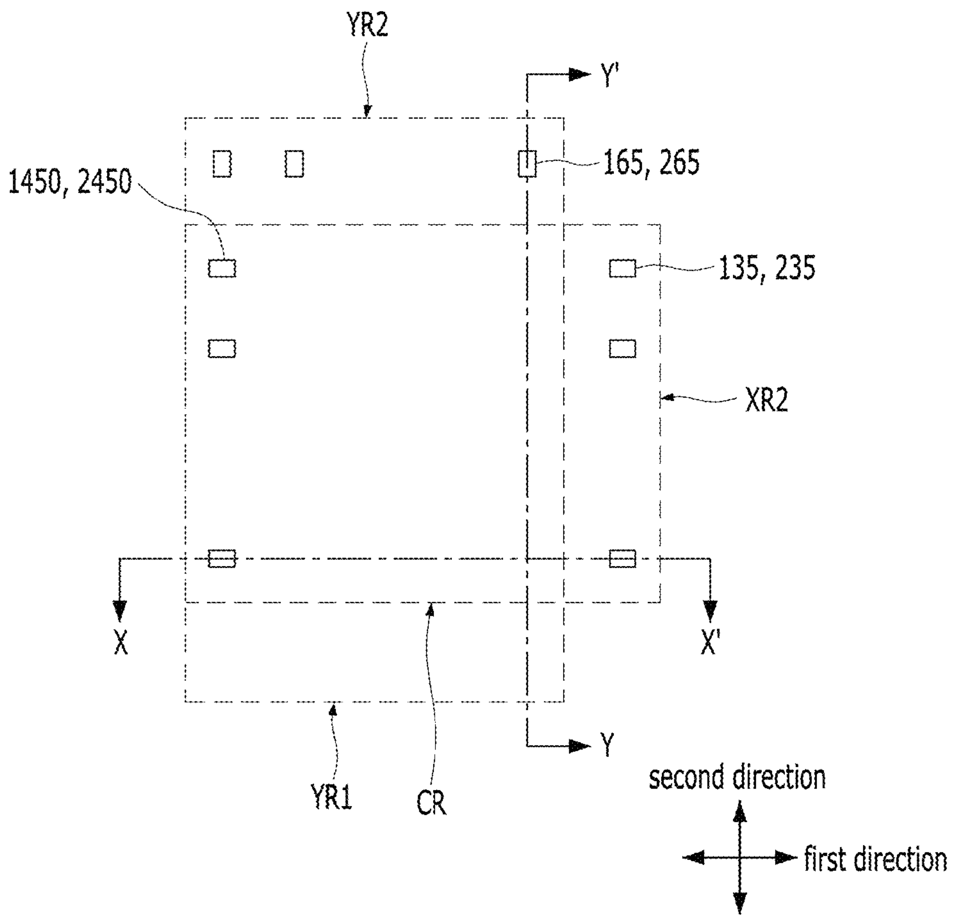
FIG. 5A is a plan view illustrating a semiconductor device according to another embodiment of the present disclosure.
Figure 5B:
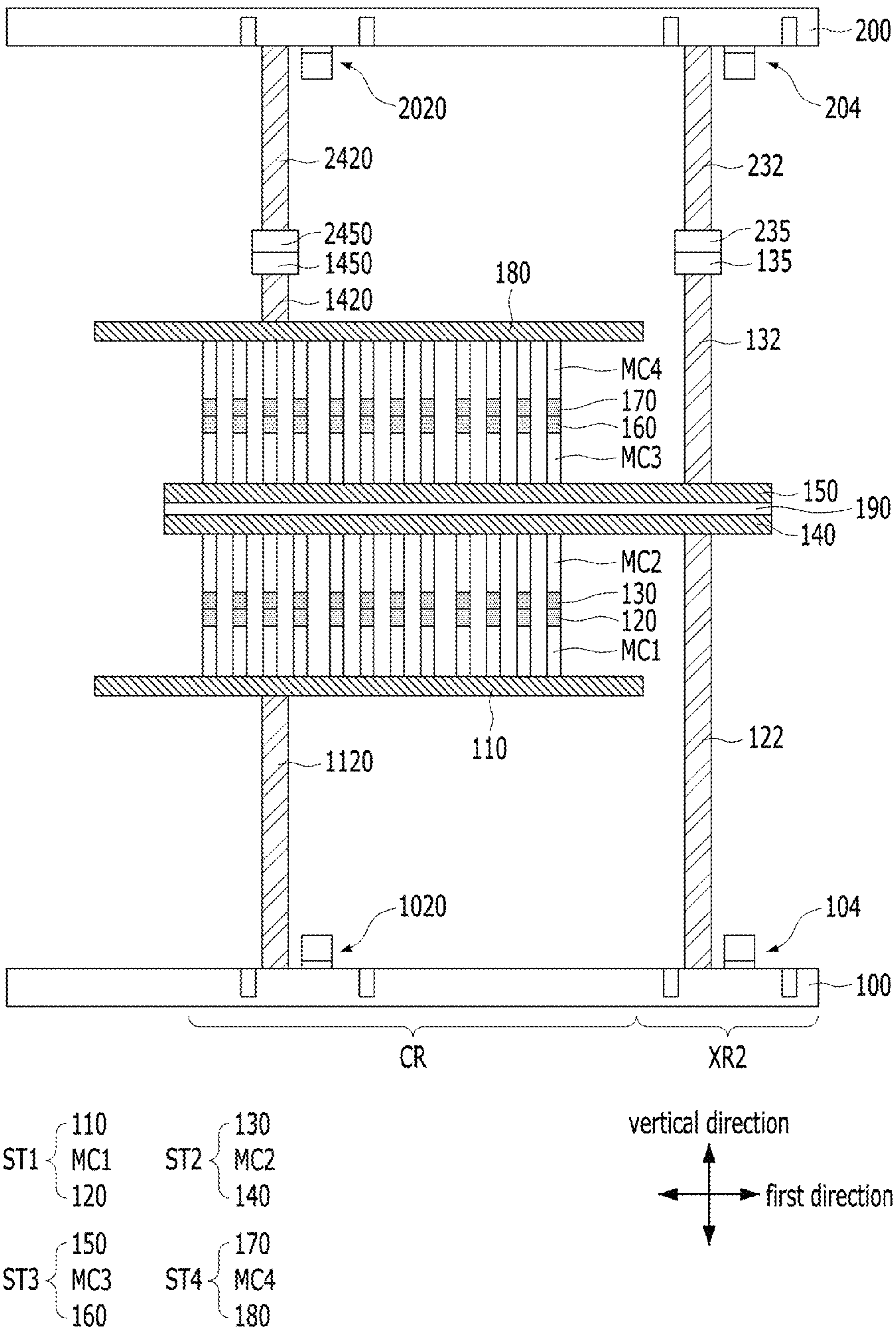
FIG. 5B is a cross-sectional view taken along a line X-X' of FIG. 5A.

FIG. 5A is a plan view illustrating a semiconductor device according to another embodiment of the present disclosure, and FIG. 5B is a cross-sectional view taken along a line X-X' of FIG. 5A. Differences from the semiconductor device of FIGS. 3A to 3C will be mainly described, and parts substantially identical to those of the semiconductor device of FIGS. 3A to 3C may be denoted by the same reference numerals, and detailed descriptions thereof will be omitted for the interest of brevity.

Referring to FIGS. 5A and 5B, the semiconductor device may include a first substrate structure and a second substrate structure bonded to each other.

In a plan view, the first substrate structure may include a cell region CR, a second word line driving circuit region XR2, and first and second bit line driving circuit regions YR1 and YR2. Also, in a plan view, the second substrate structure may include a cell region CR, a second word line driving circuit region XR2, and first and second bit line driving circuit regions YR1 and YR2. That is, the first word line driving circuit region XR1 of the above-described embodiment of FIGS. 3A to 3C may be omitted. Alternatively, it may be said that the first word line driving circuit region XR1 of the above-described embodiment overlaps the cell region CR. For example, the first word line driving circuit region XR1 may be regarded as being included in the cell region CR. Since the first word line 110 is a lowermost line in the vertical direction and an empty space is located below the first word line 110, the driving circuit of the first word line 110 may be disposed in the cell region CR, rather than a region (e.g., the first word line driving circuit region XR1 in FIG. 3B) outside the cell region CR. Also, since the fourth word line 180 is an uppermost line in the vertical direction and an empty space is located over the fourth word line 180, the driving circuit of the fourth word line 180 may be disposed in the cell region CR.

For example, the driving circuit of the first word line 110 is shown as a transistor 1020 in FIG. 5B, and the driving circuit of the fourth word line 180 is shown as a transistor 2020 in FIG. 5B.

The first word line 110 may be electrically connected to the driving circuit of the first word line 110, that is, a junction region of the transistor 1020 through the first contact structure 1120 of the cell region CR. The fourth word line 180 may be electrically connected to the driving circuit of the fourth word line 180, that is, a junction region of the transistor 2020 through the fourth contact structure 1420, a first bonding pad 1450, a fourth bonding pad 2450, and a seventh contact structure 2420 of the cell region CR.

According to the embodiment of FIGS. 5A and 5B, since the first word line driving circuit region is omitted (or overlaps the cell region CR), the area of the semiconductor device may be further reduced.

According to the above embodiments of the present disclosure, it may be possible to reduce the area of the semiconductor device.

Although various embodiments have been described for illustrative purposes, it will be apparent to those skilled in the art that various changes and modifications may be made without departing from the spirit and scope of the present teachings as defined in the following claims.

What is claimed is:

1. A semiconductor device comprising:

a first substrate structure including:

a first substrate;

a first word line, a first bit line, a second bit line, a second word line, a third word line, a third bit line, a fourth bit line, and a fourth word line that are arranged over the first substrate; and first, second, third, and fourth memory cells, the first memory cell being disposed between the first word line and the first bit line, the second memory cell being disposed between the second word line and the second bit line, the third memory cell being disposed between the third word line and the third bit line, and the fourth memory cell being disposed between the fourth word line and the fourth bit line; and a second substrate structure disposed over the first substrate structure and including a second substrate, wherein the first and second word lines, and the first and second bit lines are connected to a first driving circuit included in the first substrate, and wherein the third and fourth word lines, and the third and fourth bit lines are connected to a second driving circuit included in the second substrate.

2. The semiconductor device according to claim 1, wherein the second word line and the third word line are electrically insulated from each other, and wherein the first substrate structure further includes a first contact structure disposed between the first word line and the first substrate, a second contact structure disposed between the second word line and the first substrate, a third contact structure disposed over the third word line, a fourth contact structure disposed over the fourth word line, a first bonding pad disposed over the fourth contact structure, and a second bonding pad disposed over the third contact structure.

3. The semiconductor device according to claim 1, wherein the first bit line and the second bit line are electrically connected with each other, and the third bit line and the fourth bit line are electrically connected with each other, and wherein the first substrate structure further includes a fifth contact structure disposed between the first bit line and the first substrate, a sixth contact structure disposed over the fourth bit line, and a third bonding pad disposed over the sixth contact structure.

4. The semiconductor device according to claim 2, wherein the first bit line and the second bit line are electrically connected with each other, and the third bit line and the fourth bit line are electrically connected with each other, and wherein the first substrate structure further includes a fifth contact structure disposed between the first bit line and the first substrate, a sixth contact structure disposed over the fourth bit line, and a third bonding pad disposed over the sixth contact structure.

5. The semiconductor device according to claim 1, wherein the first substrate structure further includes an insulating material interposed between the second word line and the third word line.

6. The semiconductor device according to claim 1, wherein the first bit line and the second bit line are in direct contact with each other, and the third bit line and the fourth bit line are in direct contact with each other.

7. A semiconductor device comprising:

a first substrate structure including:

a first substrate;

a first word line, a fifth bit line, a second word line, a third word line, a sixth bit line, and a fourth word line that are arranged over the first substrate; and first, second, third, and fourth memory cells, the first memory cell being disposed between the first word line and the fifth bit line, the second memory cell being disposed between the second word line and the fifth bit line, the third memory cell being disposed between the third word line and the sixth bit line, and the fourth memory cell being disposed between the fourth word line and the sixth bit line; and a second substrate structure disposed over the first substrate structure and including a second substrate, wherein the first and second word lines, and the fifth bit line are connected to a first driving circuit included in the first substrate, and wherein the third and fourth word lines, and the sixth bit line are connected to a second driving circuit included in the second substrate.

8. The semiconductor device according to claim 1, wherein the second word line and the third word line are electrically insulated from each other, and wherein the first substrate structure further includes a first contact structure disposed between the first word line and the first substrate, a second contact structure disposed between the second word line and the first substrate, a third contact structure disposed over the third word line, a fourth contact structure disposed over the fourth word line, a first bonding pad disposed over the fourth contact structure, and a second bonding pad disposed over the third contact structure.

9. The semiconductor device according to claim 7,
wherein the first substrate structure further includes a fifth contact structure disposed between the first bit line and the first substrate, a sixth contact structure disposed over the fourth bit line, and a third bonding pad disposed over the sixth contact structure.

10. The semiconductor device according to claim 8,
wherein the first substrate structure further includes a fifth contact structure disposed between the first bit line and the first substrate, a sixth contact structure disposed over the fourth bit line, and a third bonding pad disposed over the sixth contact structure.

11. The semiconductor device according to claim 8, wherein the first substrate structure further includes an insulating material interposed between the second word line and the third word line.

12. A method for fabricating a semiconductor device comprising:
forming a first substrate structure including:
a first substrate;
a first word line, a first bit line, a second bit line, a second word line, a third word line, a third bit line, a fourth bit line, and a fourth word line that are arranged over the first substrate; and
first, second, third, and fourth memory cells, the first memory cell being disposed between the first word line and the first bit line, the second memory cell being disposed between the second word line and the second bit line, the third memory cell being disposed between the third word line and the third bit line, and the fourth memory cell being disposed between the fourth word line and the fourth bit line;
forming a second substrate structure including a second substrate;
disposing the second substrate structure over the first substrate structure in which the second substrate structure is inverted; and
coupling the first substrate structure and the second substrate structure by hybrid bonding,
wherein the first and second word lines, and the first and second bit lines are connected to a first driving circuit included in the first substrate, and
wherein the third and fourth word lines, and the third and fourth bit lines are connected to a second driving circuit included in the second substrate.

13. The method according to claim 12, wherein the first substrate structure further includes a first contact structure disposed between the first word line and the first substrate, a second contact structure disposed between the second word line and the first substrate, a third contact structure disposed over the third word line, a fourth contact structure disposed over the fourth word line, a first bonding pad disposed over the fourth contact structure, and a second bonding pad disposed over the third contact structure,
wherein the second substrate structure further includes a seventh contact structure and an eighth contact structure that are disposed below the second substrate, and a fourth bonding pad and a fifth bonding pad that are disposed below the seventh contact structure and the eighth contact structure, respectively, and
wherein the step of coupling the first substrate structure and the second substrate structure comprises directly bonding the first bonding pad to the fourth bonding pad, and directly bonding the second bonding pad to the fifth bonding pad.

14. The method according to claim 12, wherein the first substrate structure further includes a fifth contact structure disposed between the first bit line and the first substrate, a sixth contact structure disposed over the fourth bit line, and a third bonding pad disposed over the sixth contact structure,
wherein the second substrate structure further includes a ninth contact structure disposed below the second substrate and a sixth bonding pad disposed below the ninth contact structure, and
wherein the step of coupling the first substrate structure and the second substrate structure comprises directly bonding the third bonding pad to the sixth bonding pad.

15. The method according to claim 13, wherein the first substrate structure further includes a fifth contact structure disposed between the first bit line and the first substrate, a sixth contact structure disposed over the fourth bit line, and a third bonding pad disposed over the sixth contact structure, and
wherein the first bonding pad, the second bonding pad, and the third bonding pad are disposed at substantially the same level in the vertical direction when coupling the first substrate structure and the second substrate structure.

16. The method according to claim 12, wherein the first substrate structure further includes a first contact structure disposed between the first word line and the first substrate, a second contact structure disposed between the second word line and the first substrate, a third contact structure disposed over the third word line, a fourth contact structure disposed over the fourth word line, a first bonding pad disposed over the fourth contact structure, and a second bonding pad disposed over the third contact structure,
wherein the second substrate structure further includes a seventh contact structure, an eighth contact structure, and a ninth contact structure that are disposed below the second substrate, and a fourth bonding pad, a fifth bonding pad, and a sixth bonding pad that are disposed below the seventh contact structure, the eighth contact structure, and the ninth contact structure, respectively, and
wherein the step of coupling the first substrate structure and the second substrate structure comprises directly bonding the first bonding pad to the fourth bonding pad, and directly bonding the second bonding pad to the fifth bonding pad, and directly bonding the third bonding pad to the sixth bonding pad.

* * * * *